(12) United States Patent
Kaajakari

(10) Patent No.: US 8,723,611 B2
(45) Date of Patent: May 13, 2014

(54) MICROMECHANICAL RESONATOR

(75) Inventor: Ville Kaajakari, Pasadena, CA (US)

(73) Assignee: Murata Electronics Oy, Vantaa (FI)

( * ) Notice: Subject to any disclaimer, the term of this patent is extended or adjusted under 35 U.S.C. 154(b) by 115 days.

(21) Appl. No.: 13/032,106

(22) Filed: Feb. 22, 2011

(65) Prior Publication Data
US 2011/0210800 A1 Sep. 1, 2011

(30) Foreign Application Priority Data

Feb. 22, 2010 (FI) ........................................ 20105168

(51) Int. Cl.
H03B 5/30 (2006.01)
(52) U.S. Cl.
USPC ........... 331/154; 331/107 A; 331/156; 331/96
(58) Field of Classification Search
USPC ................................ 331/154, 107 A, 96, 156
See application file for complete search history.

(56) References Cited

U.S. PATENT DOCUMENTS

| 3,727,151 | A |   | 4/1973  | Koehler         |         |
|-----------|---|---|---------|-----------------|---------|
| 4,306,456 | A |   | 12/1981 | Maerfeld        |         |
| 5,214,279 | A | * | 5/1993  | Hakamata ...... | 250/234 |
| 5,767,405 | A |   | 6/1998  | Bernstein et al.|         |
| 5,839,062 | A |   | 11/1998 | Nguyen et al.   |         |
| 6,874,363 | B1|   | 4/2005  | Foote et al.    |         |
| 7,876,177 | B2| * | 1/2011  | Ni .............. | 333/186 |
| 8,334,736 | B2| * | 12/2012 | Kaajakari ..... | 333/186 |
| 2005/0150297 | A1 |   | 7/2005  | Ayazi et al. | |
| 2005/0242904 | A1 |   | 11/2005 | Lutz et al.  | |
| 2009/0160581 | A1 |   | 6/2009  | Hagelin       | |
| 2009/0184781 | A1 |   | 7/2009  | Ni            | |
| 2009/0189481 | A1 |   | 7/2009  | Kaajakari     | |

FOREIGN PATENT DOCUMENTS

GB            1441192        6/1976

OTHER PUBLICATIONS

Search Report, Oct. 14, 2010, a total of 2 pages.
International Search Report application No. PCT/FI2011/050152 dated Jun. 21, 2011.
Finnish Search Report dated Jul. 24, 2013 for corresponding Finnish Application No. 20105168.

* cited by examiner

*Primary Examiner* — Arnold Kinkead
(74) *Attorney, Agent, or Firm* — Squire Sanders (US) LLP

(57) ABSTRACT

The object of the invention is to provide an improved structure for a microelectromechanical (MEMS) resonator. According to a first aspect of the invention, the resonator structure in accordance with the invention has a characteristic frequency of oscillation in combination with a given mechanical amplitude, whereby to set said mechanical amplitude, in the resonator structure, by way anchoring at an anchor point located at a given point of the resonator structure substrate, a first element is adapted oscillatory and a second element is adapted oscillatory in such a manner that at least one of said first element and of said second element are arranged to oscillate synchronously with regard to said anchor point, whereby the location of said anchor point is selected to be substantially within the joint projection defined by the dimensions of said first and said second element.

19 Claims, 10 Drawing Sheets

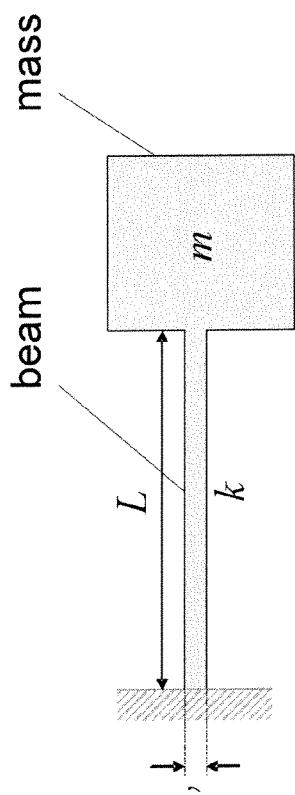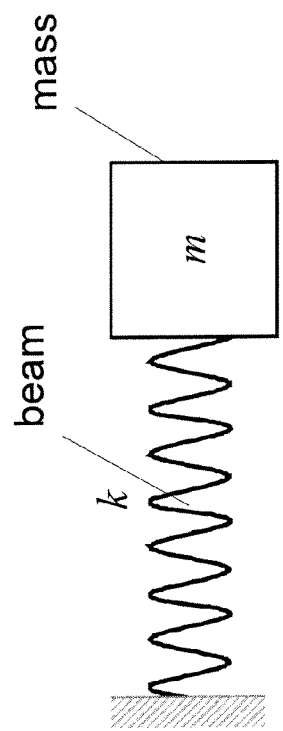
Fig. 1A PRIOR ART
Fig. 1B PRIOR ART

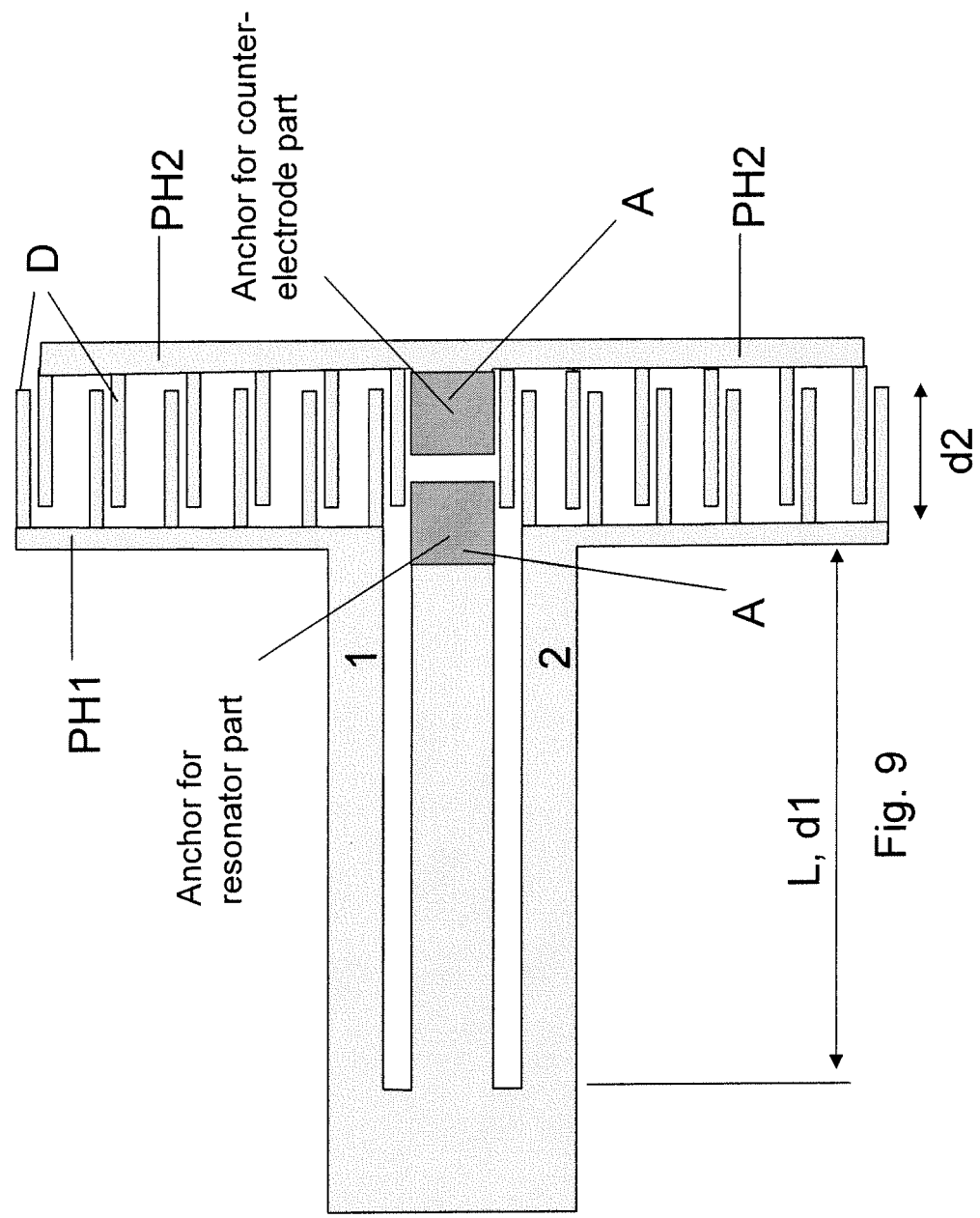

MICROMECHANICAL RESONATOR

The invention relates generally to the design of micromechanical resonators, more specifically to the design of microelectromechanical systems (MEMS) resonators. It is an object of the invention to provide an improved resonator structure of the microelectromechanical system technology (MEMS) having a construction suited for use under harsh conditions in a reliable fashion, particularly in small-scale applications.

BACKGROUND OF THE INVENTION

A resonator is a key component in various timing and frequency reference applications. Resonators are actuated to oscillate close to their natural, characteristic resonant frequency that is determined by the material, shape and/or characterizing dimensions of the resonator or the like-component serving such a function.

For use in reference and timing functions, accurate controllability/settability of the operating frequency is a must. In typical applications, the inaccuracy of frequency control may be allowed to be in the range of 1-100 ppm (parts per million). Such a ppm-level precision sets tight limits for the manufacturing tolerances. Moreover, additional mechanical and/or electrical fine-tuning is often necessary in the final adjustment.

Micromechanical resonators are widely used in MEMS-based equipment as their key component. As examples of such pieces of equipment may be mentioned microgyroscopes, microvibromotors, micromachines and microwave systems. The resonators are driven by electrostatic actuation so as to oscillate close to their characteristic, natural resonant frequency.

Additionally, micromechanical resonators can be used to complement embodiments of quartz-resonator-based technology in frequency-reference devices, whereby their frequency accuracy must be improved before they can entirely replace quartz-based oscillator technology in certain applications.

Micromechanical resonators are fabricated by combining optical lithography and etching techniques in a fashion required in this category of scale so as to offer benefits over conventional quartz-based resonator technology. However, the manufacturing process can cause variations up to several percent in the dimensions of the devices being manufactured.

For better understanding of prior-art solutions vs. the embodiments of the present invention, reference is next made to FIGS. 1A ja 1B as follows:

FIG. 1A shows the basic structure of a prior-art resonator.
FIG. 1B shows a lumped mechanical model of a prior-art resonator.

Accordingly, FIG. 1A illustrates the basic structure of a prior-art resonator as such. A simple resonator comprises a spring element (beam) and a rectangular mass element (mass). The spring element can be, e.g., a mechanical cantilever spring (beam) as illustrated in FIG. 1.

In a simple resonator of FIG. 1A, the characteristic resonant frequency $\omega_0$ is $$\omega_0 = \sqrt{\frac{k}{m}}, \quad (1)$$

where the spring constant k is $$k = Y \frac{w^3 h}{4L^3}. \quad (2)$$

FIG. 1B illustrates a lumped model of a prior-art basic resonator. Herein, Y is the Young's modulus for the spring material, w is the width of the spring element, h is the height thereof and L is the characteristic length thereof. The width w of the spring element is typically quite small and, due to cubic-law dependence, the resonant frequency $\omega_0$ is sensitive to variations in the spring element width w.

First-order change in the resonant frequency $\omega_0$ in relation to change in the spring element width is $$\frac{\Delta \omega_0}{\omega_0} = \frac{3}{2} \frac{\Delta w}{w}, \quad (3)$$

where $\partial \omega_0$ is infinitesimal change of frequency caused by an infinitesimal change $\partial \omega$ in the spring element width. One of the most significant problems in the design of micro-mechanical resonators is the variation of the resonant frequency, which is caused by insufficiently controlled or otherwise poor precision in the mechanical dimensions of the resonator structures.

For instance, assessed on the basis of Eq. 3, it can be seen that if the spring element width varies by 4%, also the resonant frequency varies, however, as much as 6% or 60,000 ppm.

Related hereto, patent publication WO 2009/092846 A1 describes a prior-art method for controlling the effects of manufacturing precision on problems concerning frequency variations.

It must be understood, however, that under disturbance situations the forces imposed on a resonator affect its function through subjecting the resonator and/or parts thereof to acceleration. Hereby, the resonator structures are deformed and its oscillating movements may be interfered even if the resonator would have a robust design. The effects of strong disturbing forces may additionally cause wide-amplitude movements of long spring-like structures supported by one end only, whereby they may under certain conditions hit other parts of the structure and even undergo mechanical damage or interfere with the electrical signals used for controlling the operation of the structure. To cope with such instances, it is necessary to design the interelectrode gaps with a guard distance that in capacitive resonators, for instance, may cause problems when a sufficiently high capacitance must attained in a relatively small structure. On the other hand, the goal toward a higher capacitance may require adding more mass to the spring elements which resultingly may affect the resonance frequency in an undesirable manner through the inertia of the mass, for instance.

SUMMARY

It is an object of the invention to provide such an improved design structure for a microelectromechanical systems (MEMS) resonator, which is insensitive to interference, yet facilitating a small size combined with a high capacitance and is able to serve as a reliable frequency reference.

According to a first aspect of the invention, the resonator structure in accordance with the invention has a characteristic frequency of oscillation in combination with a given mechanical amplitude, whereby setting said mechanical amplitude is accomplished by having in the resonator structure, through anchoring at an anchor point located at a given point of the resonator structure substrate, a first element adapted oscillatory and a second element adapted oscillatory in such a manner that at least one of said first elements and said second elements are arranged to oscillate synchronously with regard to said anchor point, whereby the location of said anchor point is selected to be substantially within the joint projection defined by the dimensions of said first and said second element.

According to an embodiment of the invention, the resonator structure in accordance with the first aspect of the invention comprises such a one kind of said one first element that comprises at least one supportive beam. Hereby the supportive beam can have attached thereto a plurality of other spring elements similar to said first element, the other spring elements not necessarily having the same characteristic dimensions.

According to an embodiment of the invention, in the resonator structure in accordance with the first aspect of the invention, said first element comprises a plurality of dendrites. Hereby each dendrite can have an individual characteristic dimension that may be its cross-sectional area, length, width, thickness and/or mass for setting the individual resonant frequency of the dendrite and/or setting the characteristic frequency of said first element. In embodiments of the invention, dendrites can also be utilized for providing electrode area in capacitive applications for embodiments either in the sensor structure and/or exciting frame structure. Hereby a proper choice of the support point allows the use of a smaller amplitude of the mechanical oscillation and, resultingly, provides a higher capacitance by virtue of the small interelectrode gap thus also offering a more compact size.

According to an embodiment of the invention, in the resonator structure in accordance with the first aspect of the invention, the dendrites comprise a plurality of beam-like branches.

According to an embodiment of the invention, in the resonator structure in accordance with the first aspect of the invention, a characteristic dimension of at least one of said first and said second elements is predetermined to set the frequency of said mechanical characteristic oscillation to a given value.

According to an embodiment of the invention, in the resonator structure in accordance with the first aspect of the invention in a first element, in at least one of the dendrites in the plurality of dendrites at least one characteristic dimension is predetermined to set the frequency of said mechanical characteristic oscillation to a given value.

According to an embodiment of the invention, the resonator structure in accordance with the first aspect of the invention comprises a plurality of dendrites having the same frequency of mechanical characteristic oscillation.

According to an embodiment of the invention, the resonator structure in accordance with the first aspect of the invention comprises such a plurality of dendrites that have their frequencies of mechanical characteristic oscillation adjusted different from each other under a given rule.

According to an embodiment of the invention, in the resonator structure in accordance with the first aspect of the invention the characteristic frequency of dendrite is predetermined by virtue of the mechanical characteristic dimension and/or mass of the dendrite.

According to an embodiment of the invention, in the resonator structure in accordance with the first aspect of the invention at least certain ones of said first and said second elements comprise beam-like branches attached to supportive beam with the help of a differently oriented connecting element.

According to an embodiment of the invention, the resonator structure in accordance with the first aspect of the invention comprises a plurality of resonators having the shape of E, in said plurality at least one of said resonators being implemented as a letter-shaped resonator structure.

According to an embodiment of the invention, in the resonator structure in accordance with the first aspect of the invention at least one of said letter-shaped elements has a shape selected from the group including letters A, B, C, E, F, H, I, K, L, M, N, S, T, U, V, W, X, Y, Z.

According to an embodiment of the invention, in the resonator structure in accordance with the first aspect of the invention the anchor point is selected for excitation of a given harmonic mechanical oscillation at a given characteristic frequency of a given mechanical dimension.

According to an embodiment of the invention, in the resonator structure in accordance with the first aspect of the invention the anchor point is selected for suppression of a given harmonic mechanical oscillation at a given characteristic frequency of a given mechanical dimension.

According to an embodiment of the invention, the resonator structure in accordance with the first aspect of the invention comprises between the beam-like branches, interdigitated beams so as to implement an excitation frame structure.

According to an embodiment of the invention, the resonator structure in accordance with the first aspect of the invention comprises a fractal-like structure.

According to an embodiment of the invention, the resonator structure in accordance with the first aspect of the invention comprises a folded tuning-fork structure.

According to an embodiment of the invention, the resonator structure in accordance with the first aspect of the invention comprises a T-shaped structure.

According to an embodiment of the invention, in the resonator structure in accordance with the first aspect of the invention at least one of said first and said second elements is arranged to have a curved shape.

According to an embodiment of the invention, in the resonator structure in accordance with the first aspect of the invention said anchor point is selected so that given dimensions for setting the characteristic frequency of oscillation of said first and said second element result in a frequency ratio of a given equal-tempered interval.

According to an embodiment of the invention, in the resonator structure in accordance with the first aspect of the invention at least one of said first element, second element, the dendrite and supportive beam are specifically dimensioned so that the resonator's sensitivity of resonant frequency change to dimensional variations in manufacture, i.e., $d(\Delta\omega_0/\omega_0)/d\delta$, is or approaches zero.

According to an embodiment of the invention, in the spring element of the micro-mechanical resonator, the ratio of a characteristic dimension to the corresponding dimension of the dendrite is maximally 10, advantageously not greater than 7, even more advantageously not greater than 5.

According to an embodiment of the invention, the spring structure is adapted by anchoring to be a portion of the tuning-fork structure. According to an embodiment of the invention, said tuning-fork structure is a folded tuning-fork structure. Hereby the anchor point is adapted to the shaft of the tuning fork that shaft is situated between the prongs of the tuning-fork structure. According to an embodiment of the invention, the folded tuning-fork structure is hereby arranged to have an E-geometry. According to another embodiment of the invention, the folded tuning-fork structure is hereby arranged to have a T-geometry. According to an embodiment of the invention, the folded tuning-fork structure is hereby arranged to have an E- as well as T-geometry. According to an embodiment of the invention, the anchor point is selected so that it divides the shaft of the folded tuning-fork structure into characteristic dimensions with given characteristic frequencies resulting in a frequency ratio of an interval.

According to an embodiment of the invention, one part of the shaft has an individual dendrite structure for implementing an exciting frame structure and/or maintaining a given phase of oscillation in regard to another part of shaft. Maintaining the phase can be accomplished with the help of an electrostatic signal, for instance.

According to an embodiment of the invention, the resonant frequency of the dendrite can be expressed with the help of its width, density, length and Young's modulus as follows:

$$\omega_f = 0.8 \sqrt{\frac{Y}{\rho}} \frac{w_f}{L^2}.$$

According to an embodiment of the invention, the micromechanical resonator structure has actuator means for implementing an exciting frame structure. According to a variant embodiment, said means are electrostatic. According to an embodiment of the invention, the electrode gap is selected to be maximally three times, advantageously twice as large as the amplitude of oscillation.

According to an embodiment of the invention, the resonator structure has an electrostatic damper in its exciting frame structure as a portion thereof for attenuating electrically the amplitude and/or full-scale coupling of movements induced by mechanical forces in the resonator structure and parts thereof.

LIST OF DRAWINGS

Inasmuch reference to FIGS. 1A-1C and 2 was made during discussion of the prior art, exemplifying embodiments of the inventions are next elucidated by way of making reference to FIGS. 3-9 as a part of the following description, in which drawings FIG. 1A illustrates a basic structure of a prior-art resonator as such;

FIG. 1B illustrates a lumped mechanical model of the basic structure of a prior-art resonator as such;

FIGS. 1C-2 illustrate a tuning-fork resonator of the prior art;

FIGS. 6-9 illustrate resonator structures according to embodiment of the invention.

In the shown embodiments, the oscillation directions of some oscillators have been elucidated schematically, however, not limiting the directions of oscillation occurring with regard to the substrate, or base, only to those mentioned in the exemplifying embodiments shown.

Figure 1C:
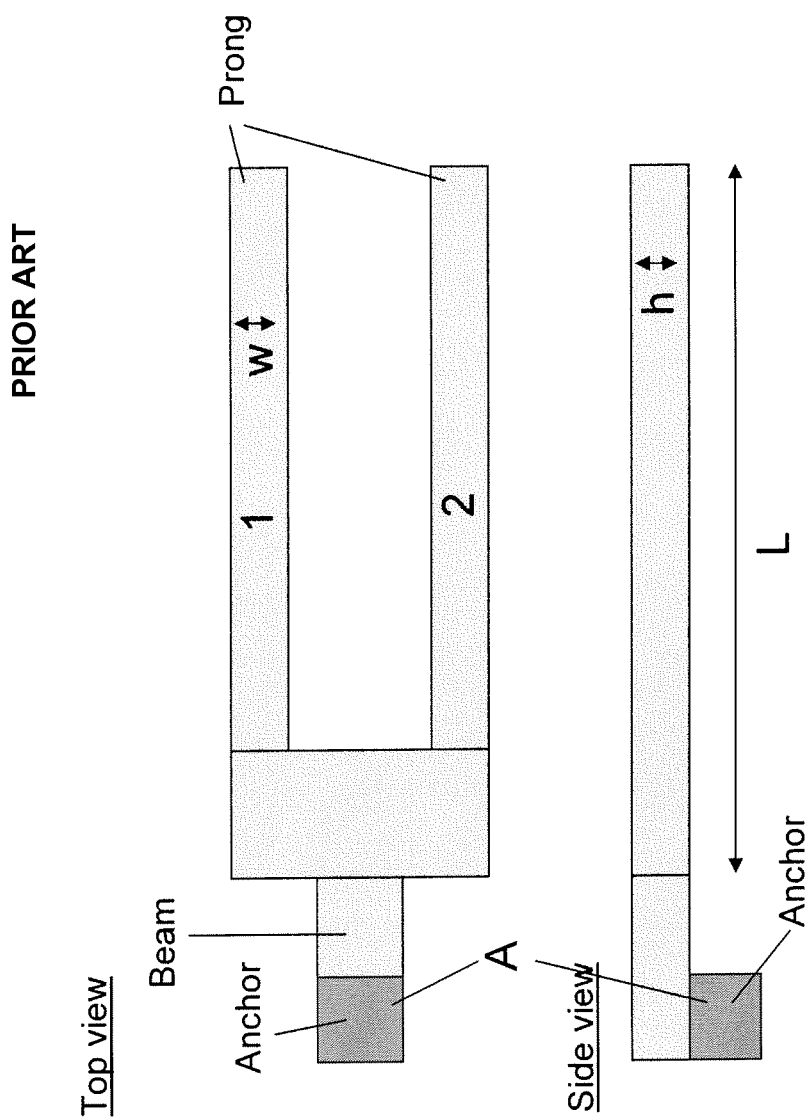
Figure 2:
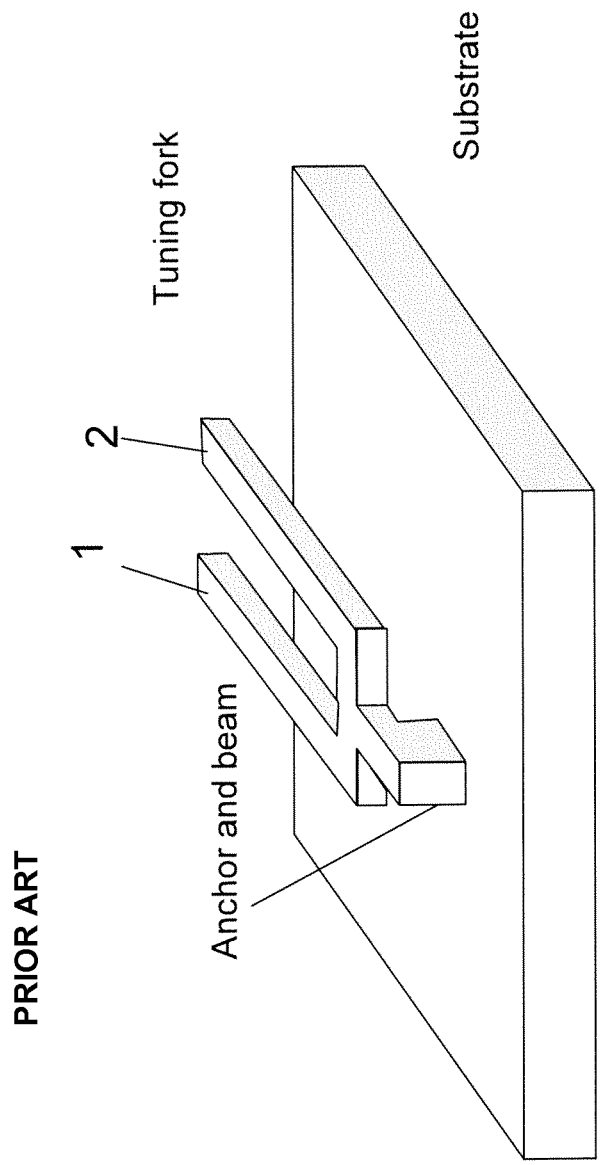

A resonator is a key component in timing or frequency reference applications. One commonly used resonator structure in timing applications is that of a tuning-fork shown in FIGS. 1C and 2. Herein the two prongs of the tuning fork vibrate in opposite phases, whereby the net movement at their common point is nulled. This is advantageous inasmuch losses at the anchor point are thus minimized.

Figure 3:
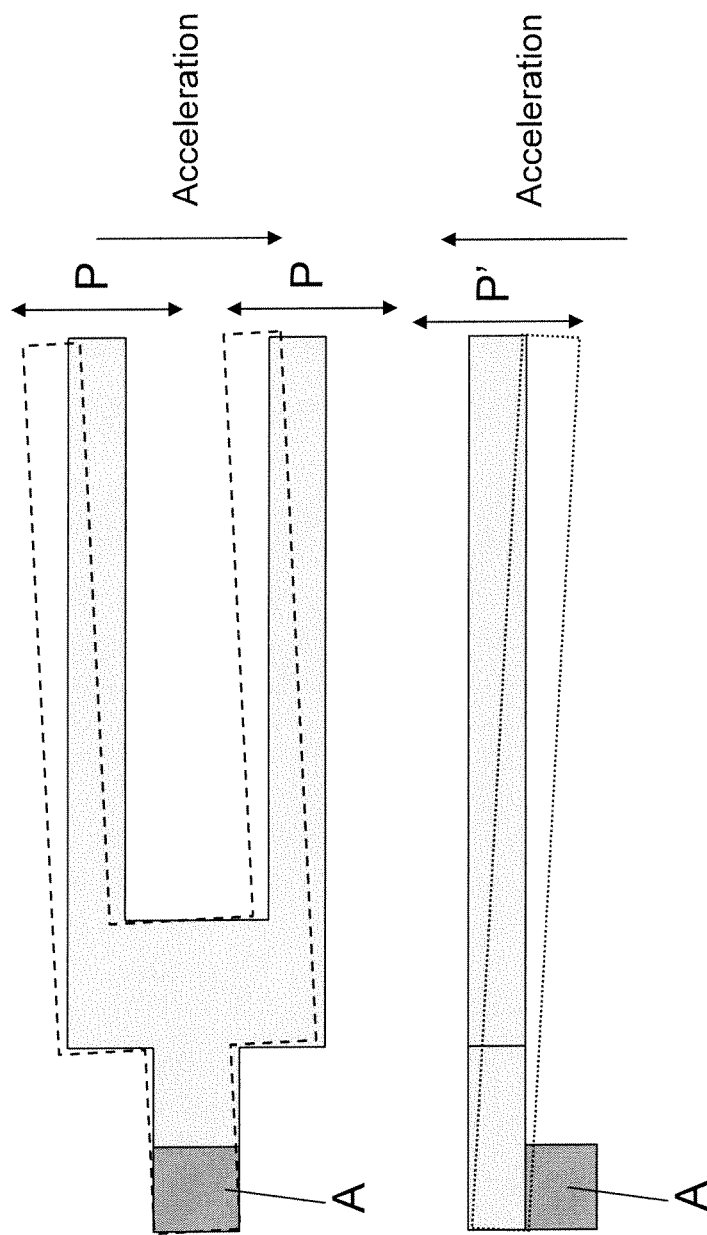
FIGS. 3-5 illustrate tuning-fork structures of some resonator embodiments.

In FIG. 3 is elucidated the basic structure of a tuning-fork type of resonator as such. As one end of the structure is fixed at the anchor point, acceleration generates a considerably high torque that in turn actuates the resonator. As a result of a sufficiently high acceleration, the prongs of the resonator may even touch the substrate or the casing.

Figure 4:
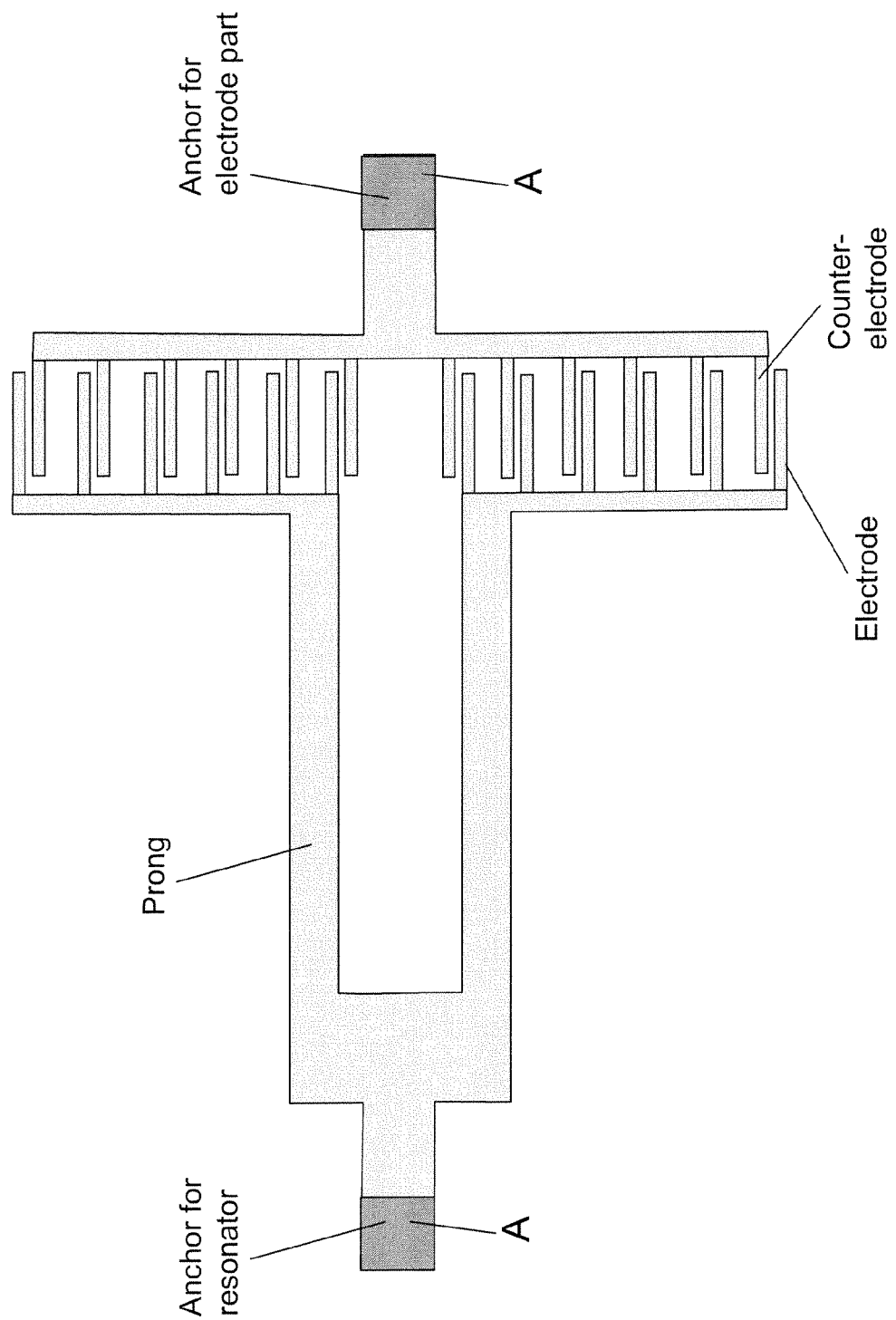

In FIG. 4 is shown a silicon micromechanical tuning-fork resonator having a plurality of electrodes in the vicinity of the prong ends of the tuning fork. The resonator can be electrostatically excited/actuated with the help of counter-electrodes located close to the resonator electrodes.

Figure 5:
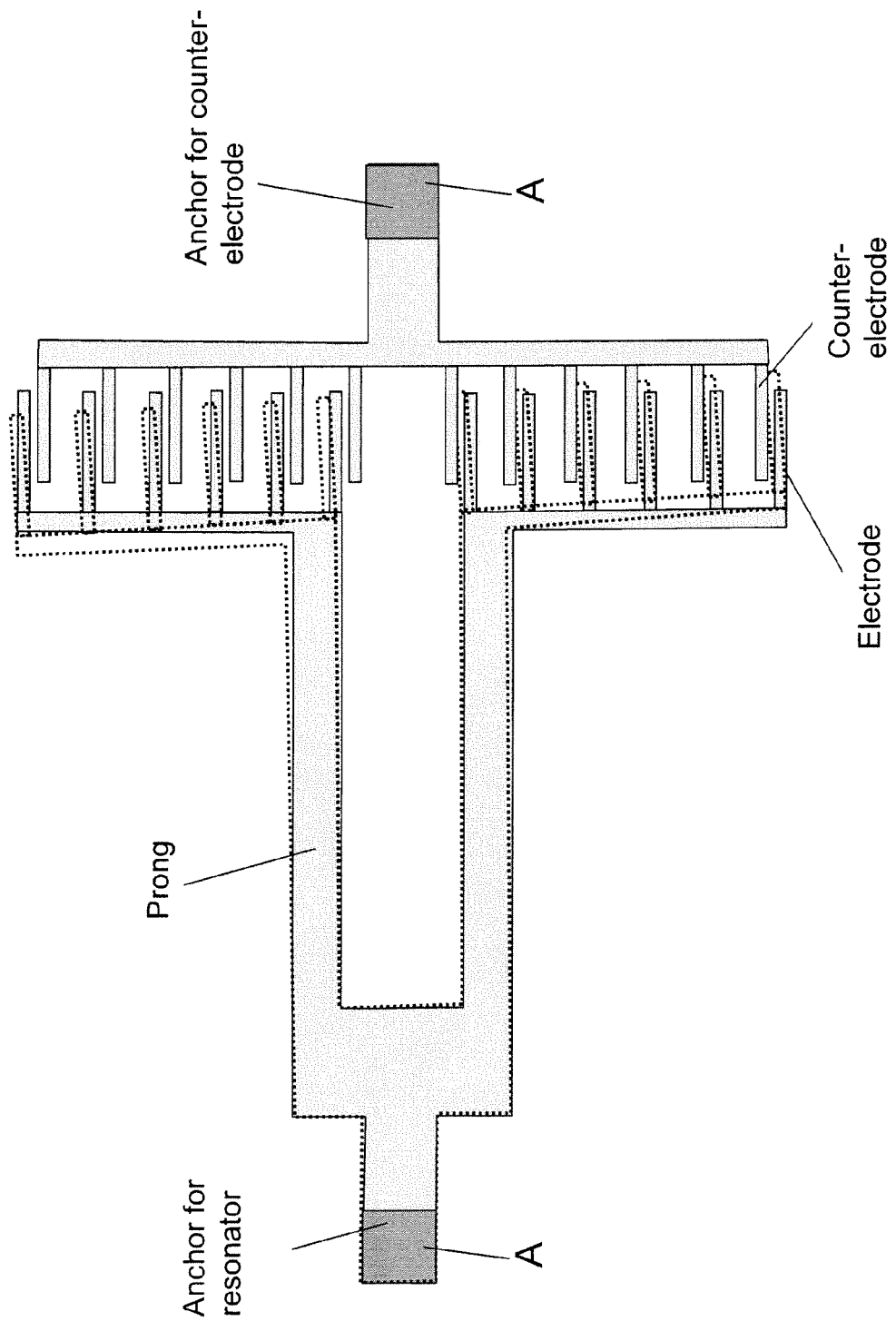

In FIG. 5 is elucidated the function of the tuning-fork resonator shown in FIG. 4. As the resonator anchor and the electrode anchor are located at the distal ends of the structure, the device is sensitive to accelerations or dimensional distortions of the substrate generated by external forces. The electrode gaps between the resonator electrodes and the counter-electrodes may be affected by deformation of the substrate, for instance.

Figure 6:
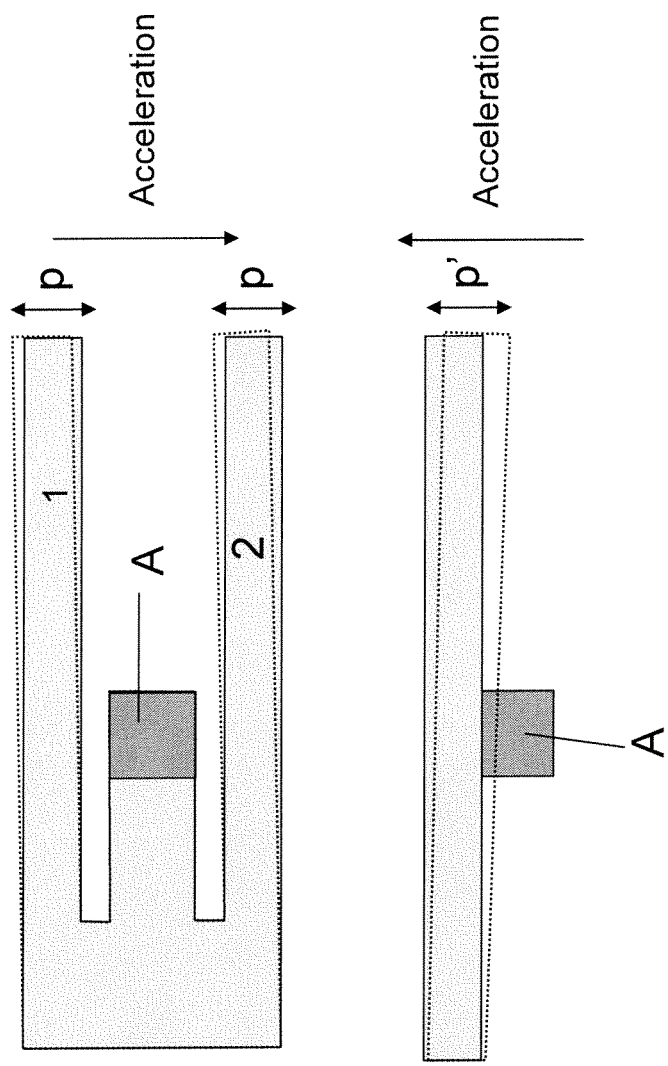

In FIG. 6 is elucidated a novel type of tuning-fork resonator. By virtue of locating the anchor point (herein the term anchor refers to the anchor point of a respective electrode) inside the prongs 1, 2 of the folded tuning fork, the anchor point A can be brought close to the center of mass of the resonator. This arrangement can substantially suppress the amplitude of movement caused by acceleration from external forces.

Figure 7:
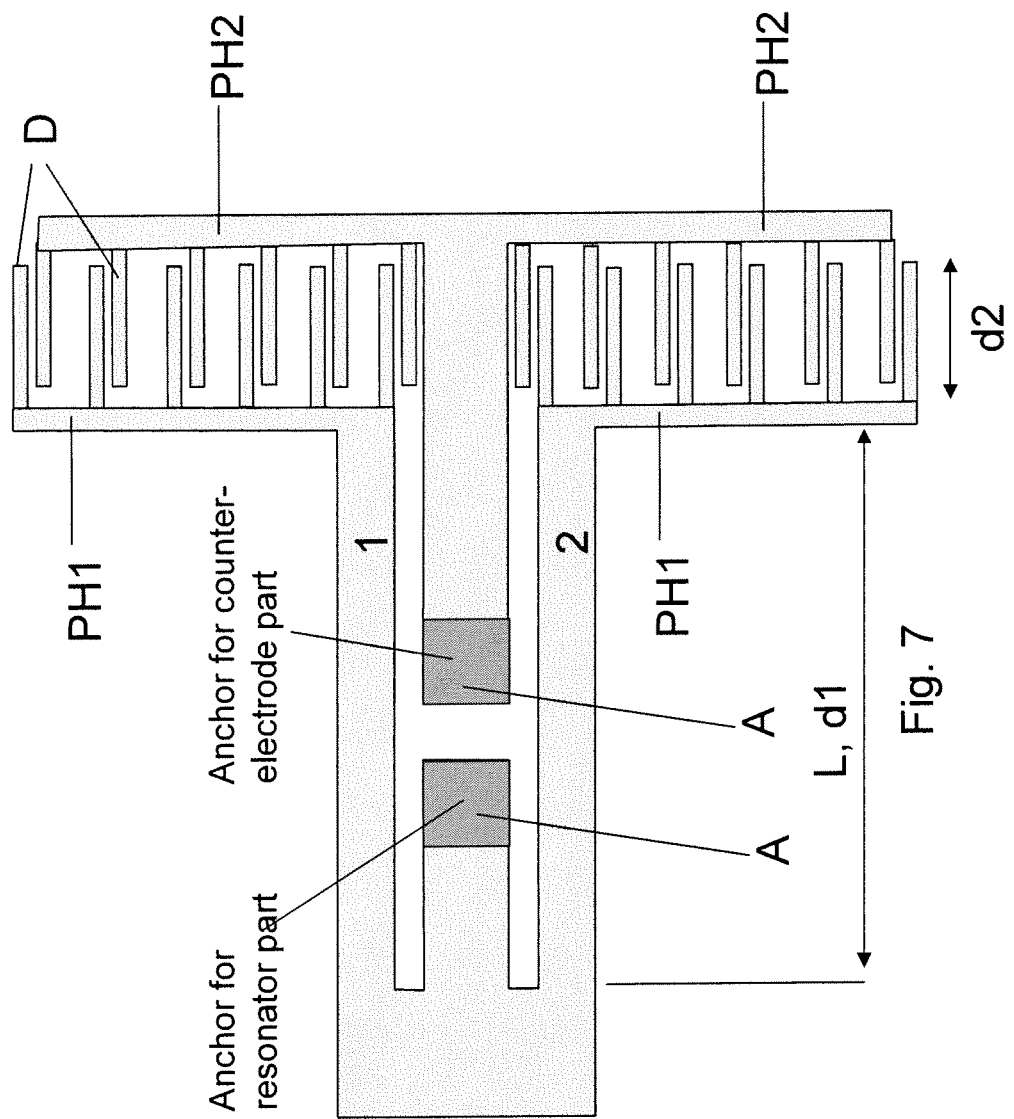

In FIG. 7 is shown an improved resonator structure having both the resonator and the anchor inside the prongs of the tuning fork. As the anchors are located close to the center of mass of the resonator and further having the anchors close to each other, the device is insensitive to accelerations or dimensional distortions of the substrate generated by external forces.

Figure 8:
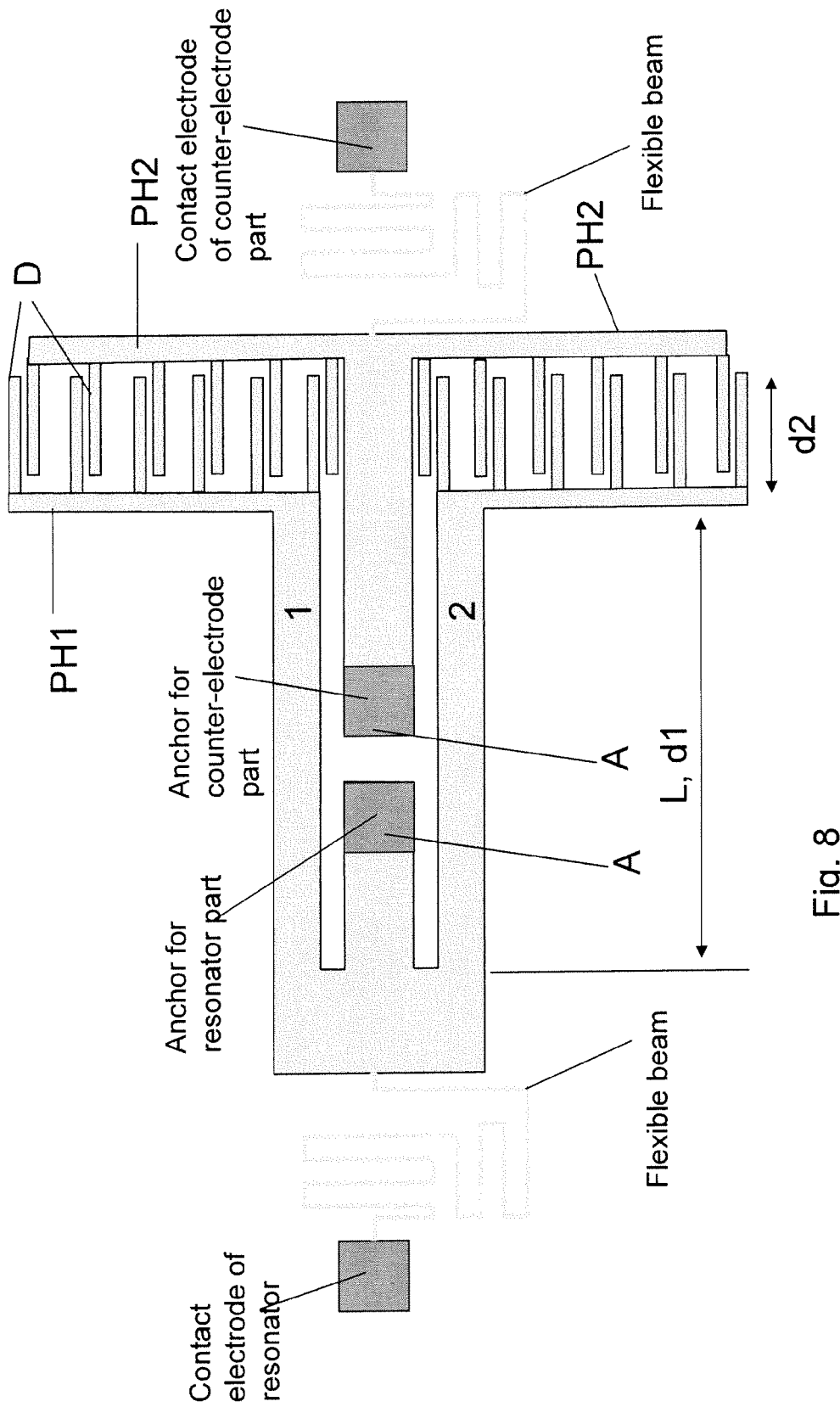

In FIG. 8 is shown one possible technique for arranging contact areas in the improved resonator structure of FIG. 7. Herein, two additional anchors are located outside the resonator structure and the electrical contacts are bonded to these electrodes. The outer anchors are electrically connected to the resonator and electrodes with the help of a flexible beam structure. Owing to the flexibility of the electrical contacts, the resonator and the electrode will not be displaced even if the resonator substrate or casing would undergo deformation or the outer anchors would be displaced.

In FIG. 9 is shown such an embodiment of the invention, wherein the anchors are moved to the right, to the other side of the tuning-fork prongs, to the center of the actuator electrodes.

Proper choice of the anchor point can reduce the amplitude of resonator's mechanical oscillation, whereby the mechanical movement becomes speedier with smaller dimensions at, e.g., the electrode gaps thus achieving a higher capacitance with regard to using large dimensions.

According to an embodiment, certain frequency components of oscillation can be linked to certain parts of the resonator by way proper choice of anchor point and adjustment of the length of the vibrating part of the resonator or some other characteristic dimension. Hereby it is possible to generate phase shifts between the parts of the resonator.

Resultingly, its is at least theoretically possible to eliminate or suppress certain harmonic frequency components occurring in the resonator, particularly if another electrode frame structure is utilized to generate/import vibration in an opposite phase at the frequency determined by the dimension of the characterizing part of the resonator, whereby the vibration acts at said frequency in an opposite phase to the oscillation phase of the resonator proper.

What is claimed is:
1. A resonator structure, comprising:
a resonator part and a counter-electrode part, wherein the resonator structure has a characteristic frequency of oscillation in combination with a given mechanical amplitude, wherein setting said mechanical amplitude is accomplished by having in the resonator structure the resonator part and the counter-electrode part, wherein the resonator part comprises
- a first anchor configured to anchor the resonator part at a first anchor point located at a given point of a resonator structure substrate, and
- a first oscillatory element and a second oscillatory element connected to the first anchor point in such a manner that said first and said second oscillatory elements are configured to oscillate synchronously with regard to said first anchor point, wherein the counter-electrode part comprises a second anchor configured to anchor the counter-electrode part at a second anchor point located at a given point of a resonator structure substrate, and wherein the locations of the first anchor point and the second anchor point are within a joint projection defined by dimensions of said first oscillatory element and said second oscillatory element.

2. The resonator structure of claim 1, wherein said first oscillatory element comprises at least one supportive beam.

3. The resonator structure of claim 1, wherein said first oscillatory element comprises a plurality of dendrites.

4. The resonator structure of claim 3, wherein the plurality of dendrites comprise a plurality of beam-like branches.

5. The resonator structure of claim 1 wherein a characteristic dimension of at least one of said first oscillatory element and said second oscillatory element is predetermined to set a frequency of said characteristic frequency of oscillation to a given value.

6. The resonator structure of claim 3, wherein a characteristic dimension of a dendrite of the plurality of dendrites is predetermined to set a frequency of said characteristic frequency of oscillation to a given value.

7. The resonator structure of claim 1, wherein the resonator structure comprises a plurality of dendrites having a same frequency of characteristic frequency of oscillation.

8. The resonator structure of claim 1, wherein the resonator structure comprises a plurality of dendrites having frequencies of characteristic frequency of oscillation adjusted different from each other under a given rule.

9. The resonator structure of claim 8, wherein a characteristic frequency of one of the plurality of dendrites is predetermined by virtue of a mechanical characteristic dimension or a mass of the one of the plurality of dendrites.

10. The resonator structure of claim 1, wherein at least one of said first oscillatory element and said second oscillatory element comprise beam-like branches attached to a supportive beam by a differently oriented connecting element.

11. The resonator structure of claim 1, wherein the resonator structure comprises a plurality of resonator parts.

12. The resonator structure of claim 1, wherein the first anchor point is selected for excitation of a given harmonic mechanical oscillation at a given characteristic frequency of a given mechanical dimension.

13. The resonator structure of claim 1, wherein the first anchor point is selected for suppression of a given harmonic mechanical oscillation at a given characteristic frequency of a given mechanical dimension.

14. The resonator structure of claim 10, further comprising a plurality of beams interdigitated between the beam-like branches to implement an excitation frame structure.

15. The resonator structure according to claim 1, wherein the resonator structure comprises a fractal-like structure.

16. The resonator structure of claim 1, wherein the resonator structure comprises a folded tuning-fork structure.

17. The resonator structure of claim 1, wherein the resonator structure comprises a T-shaped structure.

18. The resonator structure of claim 1, wherein at least one of said first oscillatory element and said second oscillatory element is arranged to have a curved shape.

19. The resonator structure of claim 1, wherein said anchor point is selected so that given dimensions for setting the characteristic frequency of oscillation of said first and said second oscillatory elements result in a frequency ratio of a given equal-tempered interval.

* * * * *